(12) United States Patent
Hu et al.

(10) Patent No.: US 7,786,917 B2
(45) Date of Patent: Aug. 31, 2010

(54) DIGITAL-TO-ANALOG CONVERTER

(75) Inventors: Pengfei Hu, Shanghai (CN); JinFu Chen, Shanghai (CN); Qinghua Yue, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 16 days.

(21) Appl. No.: 12/218,397

(22) Filed: Jul. 14, 2008

(65) Prior Publication Data

US 2010/0007539 A1 Jan. 14, 2010

(51) Int. Cl.
*H03M 1/66* (2006.01)
(52) U.S. Cl. .................. 341/150; 341/155; 341/172
(58) Field of Classification Search .......... 341/144, 341/150, 172
See application file for complete search history.

(56) References Cited

U.S. PATENT DOCUMENTS

| | | | |
|---|---|---|---|
| 6,271,783 B1 * | 8/2001 | Cairns et al. ............. | 341/144 |
| 6,452,778 B1 * | 9/2002 | Leung et al. ............. | 361/306.3 |
| 6,600,437 B1 * | 7/2003 | Confalonieri et al. ....... | 341/150 |
| 6,768,440 B1 * | 7/2004 | Troutman ................. | 341/150 |
| 7,199,746 B1 * | 4/2007 | Chowdhury et al. ........ | 341/172 |
| 2004/0257256 A1 * | 12/2004 | Leung et al. ............. | 341/172 |

* cited by examiner

*Primary Examiner*—Jean B Jeanglaude
(74) *Attorney, Agent, or Firm*—Hayes and Boone LLP

(57) ABSTRACT

A digital-to-analog converter is disclosed for converting a digital signal into its analog equivalent. The digital-to-analog converter includes a two switches capable of coupling circuit nodes to ground, a scaling capacitor having a capacitance value that equals a unit capacitance value, a first array of capacitors coupled to the first circuit node and a first switching array which couples the first array of capacitors to either ground or a reference voltage depending on the digital values of the least significant bits of the digital word being converted, a second array of capacitors coupled to the second circuit node and a second switching array which couples the second array of capacitors to either ground or the reference voltage depending on the digital values of the most significant bits of the digital word being converted.

18 Claims, 4 Drawing Sheets

DIGITAL-TO-ANALOG CONVERTER

BACKGROUND

1. Technical Field

The present invention relates digital-to-analog signal conversion and, in particular, to a two-stage charge-scaling digital-to-analog converter that utilizes unit-cell capacitors.

2. Discussion of Related Art

Modern electronics often require interfacing signals between analog and digital systems. For example, a digital audio signal must be converted into an analog signal prior to playing the signal through an audio speaker. Similarly, many digital video signals from digital media sources must be converted to an analog form prior to viewing on an analog display. Accordingly, digital signals are converted into their analog equivalents in many electronic devices.

Digital-to-analog converters ("DACs") are widely used to convert a digital signal into a corresponding analog signal, thereby allowing for communication between analog and digital systems. For example, a DAC may be used to convert an n-bit digital word in a digital signal into a substantially equivalent analog output signal. The design and performance of many DACs, however, can be sensitive to semiconductor manufacturing process errors.

Therefore, it is desirable to develop DAC designs having performance that is relatively unaffected by fabrication errors introduced during the manufacturing process.

SUMMARY

Consistent with some embodiments of the present invention, a digital-to-analog converter includes a switch capable of coupling a first and a second circuit node to ground; a scaling capacitor coupled between the first and the second circuit node; a first array of capacitors coupled to the first circuit node; a first switching array configured to selectively couple the first array of capacitors to either ground or a reference voltage; a second array of capacitors coupled to the second circuit node; and a second switching array configured to selectively couple the second array of capacitors to either ground or the reference voltage. In some embodiments, the scaling capacitor has a capacitance value that equals a unit capacitance value. Further, in certain embodiments, the first and second array of capacitors include capacitors having capacitance values that are multiples of a unit capacitance value.

Consistent with some embodiments of the present invention, a method for converting a digital signal containing an n-bit digital word to an analog signal includes coupling a first and a second circuit node to ground, the first and second circuit nodes being separated by a unit-cell scaling capacitor; coupling a first and a second array of capacitors respectively coupled to the first and second circuit nodes to ground using a first and a second switching array; de-coupling the first and second circuit node from ground; selectively coupling the first array of capacitors to either ground or a reference voltage based on the digital values of the least significant bits in a n+m-bit digital word; and selectively coupling the second array of capacitors to either ground or the reference voltage based on the digital values of the most significant bits in the n+m-bit digital word.

Further embodiments and aspects of the invention are discussed with respect to the following figures, which are incorporated in and constitute a part of this specification.

In the figures, elements having the same designation have the same or similar functions.

DETAILED DESCRIPTION

Figure 1:
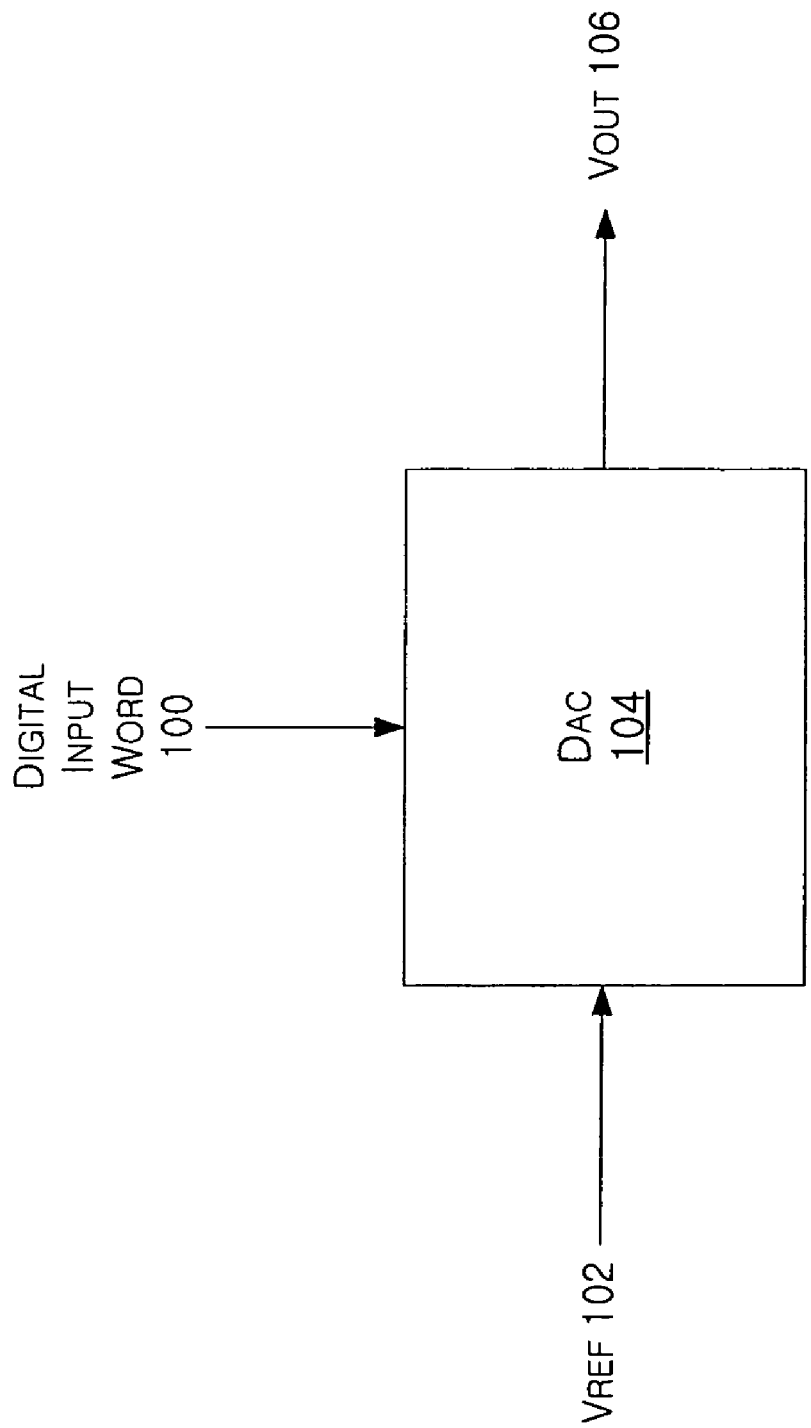
FIG. 1 illustrates a generalized block diagram of a digital-to-analog converter ("DAC") consistent with some embodiments of the present invention.

FIG. 1 illustrates a generalized block diagram of a digital-to-analog converter ("DAC") 104 consistent with some embodiments of the present invention. DAC 104 is coupled to reference voltage $V_{ref}$ 102. A digital signal containing a digital word 100 is provided to DAC 104 as an input signal. Based on the received digital input word 100, DAC 104 generates output signal voltage $V_{out}$ 106 having a voltage level that corresponds with the received digital input word 100. In some embodiments, the level output voltage $V_{out}$ 106 is proportional to a ratio determined by the received digital input word 100 and reference voltage $V_{ref}$ 102.

Figure 2:
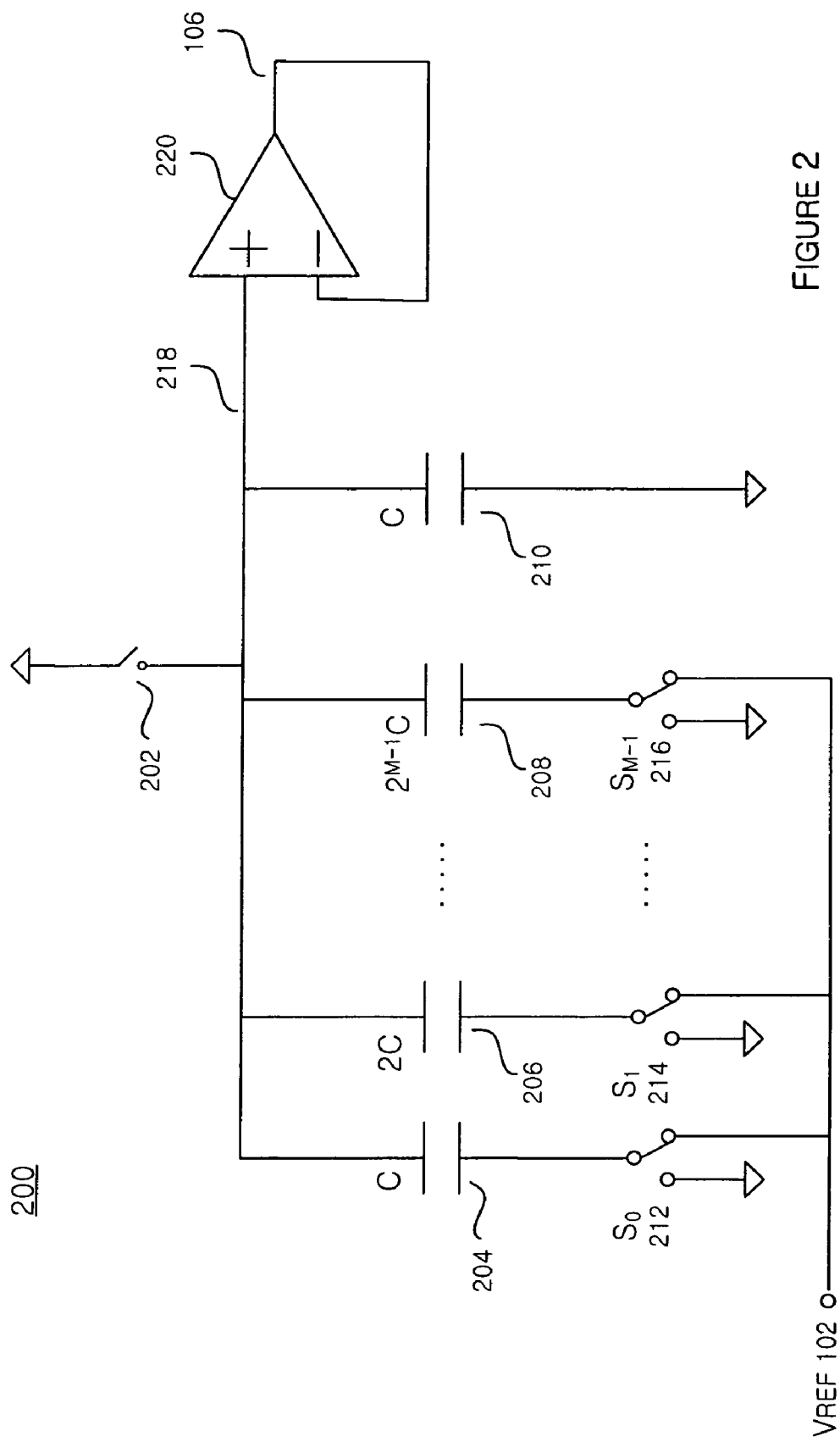
FIG. 2 illustrates a schematic diagram of a charge-scaling DAC consistent with some embodiments of the present invention.

FIG. 2 illustrates a schematic diagram of an m-bit charge-scaling DAC 200 consistent with some embodiments of the present invention. Charge-scaling DAC 200 includes switch 202, capacitors 204-208, terminating capacitor 210, bit switches 212-216, and amplifier 220. Digital-to-analog conversion may be achieved by charge-scaling DAC 200, using banks of capacitors 204-208 and bit switches 212-216. In some embodiments, the number of bit switches 212-216 and capacitors 204-208 in m-bit charge-scaling DAC 200 may be dependent upon the number of bits (m) in the digital word that is to be converted to a corresponding analog level by charge-scaling DAC 200. For example, a 3-bit charge-scaling DAC 200 may include three of capacitors 204-208 and bit switches 212-216. Similarly, a 10-bit charge-scaling DAC 200 may require ten capacitors 204-208 and ten corresponding bit switches 212-216.

Capacitors 204-208 may be coupled between circuit node 218 and bit switches 212-216 respectively. Terminating capacitor 210 may coupled between circuit node 218 and ground. Switch 202 may be coupled between circuit node 218 and ground. Thus, when switch 202 is closed, the plates of capacitors 204-208 coupled to circuit node 218 are also coupled to ground. Circuit node 218 may also be coupled to the non-inverting input terminal of amplifier 220. Output signal 106 of charge-scaling DAC 200 may be coupled to the inverting input terminal of amplifier 220, placing amplifier 220 in a negative feedback loop configuration.

As illustrated in FIG. 2, bit switches 212-216 may be configured such that the bottom plates of capacitors 204-208 coupled respectively to bit switches 212-216 are coupled to either ground or reference voltage $V_{ref}$ 102, depending on the orientation of bit switches 212-216. In some embodiments, the orientation of bit switches 212-216 may be dependent upon the value of the bits in a m-bit digital word corresponding with bit switches 212-216. For example, if the least significant bit ("LSB") of a m-bit digital word being converted by charge-scaling DAC 200 is set to a digital value of one, bit switch $S_0$ 212 may be switched to reference voltage $V_{ref}$ 102, thereby coupling the bottom plate of capacitor 204 to reference voltage $V_{ref}$ 102. Similarly, if the most significant bit ("MSB") of an m-bit digital word being converted is set to a digital value of zero, bit switch $S_{m-1}$ 216 may be switched to ground, thereby coupling the bottom plate of capacitor 208 to ground.

Charge-scaling DAC 200 may utilize unit-cell capacitors having relative sizes directly proportional to a unit capacitance value. For example, capacitor 204 as illustrated has a capacitance value of C. Capacitor 208 has a capacitance value of $2^{m-1}C$. Thus, capacitor 208 has a capacitance value of $2^{m-1}$ times the capacitance value of capacitor 204. By utilizing unit-cell capacitors in the design of charge-scaling DAC 200, the effects of semiconductor manufacturing errors can be reduced. Capacitors having accurate relative capacitance values may be fabricated more precisely than capacitors having accurate absolute capacitance values.

Prior to receiving an m-bit digital word contained in a digital signal for conversation by m-bit charge-scaling DAC 200, switch 202 may be closed, thereby coupling node 218 to ground. When node 218 is coupled to ground, the top plates of capacitors 204-208 and terminating capacitor 210 are also coupled to ground. After node 218 has been coupled to ground, switch 202 may be opened. In some embodiments, the duration of time node 218 is coupled to ground may be related to the discharge period of capacitors 204-208. Similarly, prior to receiving an m-bit digital word, bit switches 212-216 may also be switched to ground, thereby coupling the bottom plates of capacitors 204-208 to ground. In some embodiments, the duration of time that bit-switches 212-216 are coupled to ground may also be related to the discharge period of capacitors 204-208.

Upon receiving an m-bit digital word, bit switches 212-216 may be switched from ground to reference voltage $V_{ref}$ 102 depending upon the value of the bits in the received m-bit digital word corresponding with bit switches 212-216. For example, in an m-bit digital word wherein the LSB and MSB have digital values of one and all other bits in the digital word have digital values of zero, bit switches $S_0$ 212 and $S_{m-1}$ 216 may be switched to reference voltage $V_{ref}$ 102, thereby coupling the bottom plates of capacitors 204 and 208 to $V_{ref}$ 102. Similarly, all bit switches corresponding to bits in the digital word having digital values of zero (e.g., $S_1$ 214) may remain switched to ground such that the bottom plates of all capacitors coupled to such bit switches also remain coupled to ground. In some embodiments, after a period of time defined by the charging time of capacitors 204-208, bit switches $S_0$ 212 and $S_{m-1}$ 216 may be switched such that the bottom plates of capacitors 204-208 are all connected to ground.

Based on the above described operation of m-bit charge-scaling DAC 200, reference voltage $V_{ref}$ 102 may be capacitively attenuated by the equivalent parallel capacitance of all capacitors corresponding with bit switches 212-216 which are coupled to $V_{ref}$ 102 and terminating capacitor 210, which form, in effect, a capacitive voltage divider. Accordingly, the voltage at node 218 may be given by:

$$V(\text{node}_{218}) = [b_0 2^{-m} + b_1 2^{-(m-1)} + \ldots + b_{m-1} 2^{-1}] V_{ref} \quad (1)$$

wherein $b_0$ corresponds with the digital value of the of the LSB of the m-bit digital word under conversion, $b_{m-1}$ corresponds with the digital value of the MSB of the m-bit digital word under conversion, and $V_{ref}$ corresponds with reference voltage 102. Using amplifier 220 placed in a negative feedback loop configuration, the voltage at node 218 may be buffered to generate t he final output 106 of m-bit charge scaling DAC 200. Thus, the level of output 106 may be used as an analog representation of the m-bit digital word received by DAC 200.

The above described operation of DAC 200 occurs iteratively with every digital word received by DAC 200. Thus, for a sequence of digital words received by DAC 200, a corresponding sequence of analog voltage levels is produced at output 106. In between each digital word in the digital word sequence, during the period when node 218 and bit switches 212-216 are coupled to ground, the analog output of DAC 200 ideally reaches an output voltage corresponding with ground (e.g., 0 V). In this manner, the analog output 106 of DAC 200 may be viewed as a series of sampled analog levels corresponding with received the digital word sequence. As the switching time (i.e., clock speed) of DAC 200 increases, the resolution of the sampled analog signal also increases, thus producing a more uniform analog representation of the digital word sequence received by DAC 200.

When the number of bits m increases, the total size (i.e., required layout area) of capacitors in charge-scaling DAC 200 also increases. Accordingly, in implementations that require analog conversion of signals containing long digital words but also require that chip layout area be minimized, charge-scaling DAC 200 may become an impracticable digital-to-analog conversion solution.

Figure 3:
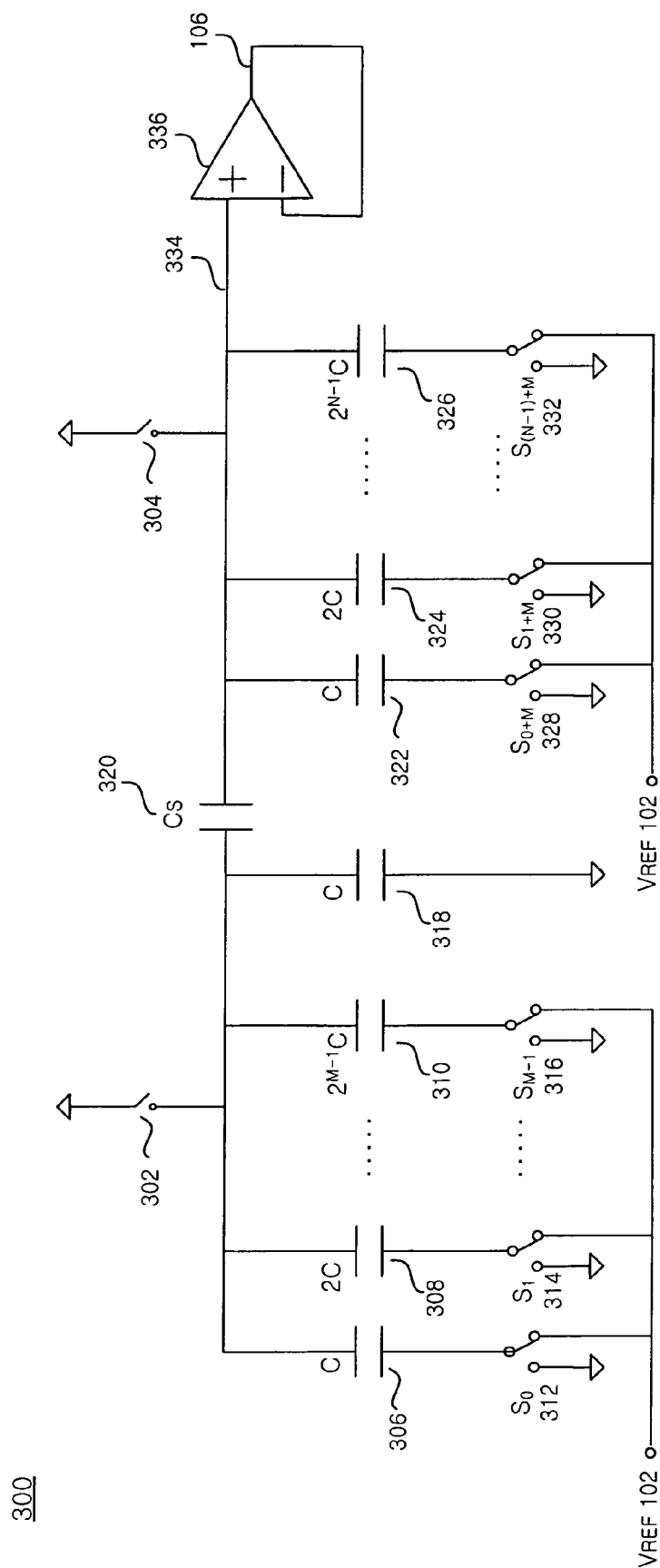
FIG. 3 illustrates a schematic diagram of a two-stage charge-scaling DAC consistent with some embodiments of the present invention.

A two-stage charge-scaling DAC 300 implementation provides the same functionality of charge-scaling DAC 200, but requires significantly less layout area to implement. FIG. 3 illustrates a schematic diagram of a two-stage charge-scaling DAC 300 consistent with some embodiments of the present invention. Two-stage charge scaling DAC 300, as illustrated, is configured to convert an n+m-bit digital word having m LSBs and n MSBs. As illustrated, two-stage charge-scaling DAC 300 may include switches 302-304, m LSB array capacitors 306-310, m LSB array switches 312-316, scaling capacitor $C_S$ 320, terminating capacitor 318, n MSB array capacitors 322-326, n MSB array switches 328-332, and amplifier 336.

Switch 302 may be configured so that the top plates of LSB array capacitors 306-310 are coupled to ground when switch 302 is closed. Similarly, switch 304 may be configured so that node 334 and the top plates of MSB array capacitors 322-326 are also coupled to ground when switch 304 is closed. In some embodiments, switch 302 and 304 may be integrated into a single switch capable of coupling the top plates of LSB array capacitors 306-310 and the top plates of MSB array capacitors 322-326 to ground. Scaling capacitor 320 may be coupled between the top plates of LSB array capacitors 306-310 and node 334. Terminating capacitor 318 may be coupled between the top plates of LSB array capacitors 306-310 and ground. Node 334 may also be coupled to amplifier 336. In some embodiments, node 334 may be coupled to the non-inverting input terminal of amplifier 336, and amplifier output 106 may be coupled to the inverting input terminal of amplifier 336, placing amplifier 336 in a negative feedback loop configuration.

As illustrated in FIG. 3, LSB array bit switches 312-316 may be coupled to the bottom plates of LSB array capacitors 306-318 and configured such that the bottom plates of LSB array capacitors 306-318 may be coupled to either ground or reference voltage $V_{ref}$ 102 depending on the orientation of LSB array bit switches 312-316. In some embodiments, the orientation of LSB array bit switches 312-316 is dependent upon the digital values of the m LSBs corresponding with LSB array bit switches 312-316 in a n+m-bit digital word. For example, if the LSB of a n+m-bit digital word being converted by two-stage charge-scaling DAC 300 is set to a digital value of 1, LSB array bit switch S$_0$ 312 may be switched to couple the bottom plate of LSB array capacitor 306 to reference voltage V$_{ref}$ 102. Similarly, if the MSB in the LSB array is set to a digital value of 0, LSB array bit switch S$_{M-1}$ 316 may be switched to couple the bottom plate of LSB array capacitor 310 to ground.

MSB array bit switches 328-332 may be coupled to the bottom plates of MSB array capacitors 322-326 and configured such that the bottom plates of MSB array capacitors 322-326 may be coupled to either ground or reference voltage V$_{ref}$ 102 depending on the orientation of MSB array switches 328-332. In some embodiments, the orientation of MSB array bit switches 328-332 is dependent upon the digital values of the n MSBs corresponding with MSB array bit switches 328-332 in a n+m-bit digital word. For example, if the LSB in the MSB array is set to a digital value of 1, MSB array bit switch S$_{0+M}$ 328 may be switched to couple the bottom plate of MSB array capacitor 322 to reference voltage V$_{ref}$ 102. Similarly, if the MSB of the n+m-bit digital word under conversion is set to a digital value of 0, MSB array bit switch S$_{(N-1)+M}$ 332 may be switched to couple the bottom plate of MSB array capacitor 326 to ground.

Prior to receiving an n+m-bit digital word contained in a digital signal for conversion by n+m-bit two-stage charge-scaling DAC 300, switches 302 and 304 may be closed, thereby coupling the top plates of LSB array capacitors 306-310, terminating capacitor 318, and MSB array capacitors 322-326 as well as both plates of scaling capacitor 320 and the non-inverting input of amplifier 336 to ground. In some embodiments, the duration of time that switches 302 and 304 are closed may be related to the discharge time(s) of LSB array capacitors 306-310, MSB array capacitors 322-326, terminating capacitor 318, and/or scaling capacitor 328. Similarly, prior to receiving an n+m-bit digital word, LSB array bit switches 312-316 and MSB array bit switches 328-332 may also be switched to ground, thereby coupling the bottom plates of LSB array capacitors 306-310 and MSB array capacitors 322-326 to ground. In some embodiments, the duration of time that LSB array bit switches 312-316 and MSB array bit switches 328-332 are oriented such that the bottom plates of LSB array capacitors 306-310 and MSB array capacitors 322-326 are coupled to ground may be related to the discharge time(s) of LSB array capacitors 306-310 and/or MSB array capacitors 322-326.

Upon receiving an n+m-bit digital word, LSB array bit switches 312-316 and MSB array bit switches 328-332 may be switched from ground to reference voltage V$_{ref}$ 102 depending on the value of the bits in the received n+m-bit digital word corresponding with LSB array bit switches 312-316 and MSB array bit switches 328-332. For example, in a n+m-bit digital word having m LSBs and n MSBs, wherein the mth bit in the n+m-bit digital word has a digital value of one and all other bits have digital values of zero, LSB array bit switch S$_{M-1}$ 312 may be switched to reference voltage V$_{ref}$ 102, thereby coupling the bottom plate of LSB array capacitor 310 to V$_{ref}$ 102. Similarly, all LSB and MSB array bit switches 312-316, 322-326 corresponding to bits in the digital word having digital values of zero (i.e., S$_0$ 312, S$_1$ 314, S$_{M-1}$ 316, S$_{0+M}$ 328, and S$_{1+M}$ 330) may remain switched to ground such that the bottom plates of all capacitors coupled to such bit switches also remain coupled to ground. In some embodiments, after a period of time related to the charging time of LSB array capacitor 310, LSB array bit switch S$_{M-1}$ 312 may be switched such that the bottom plate of all LSB and MSB array capacitors 306-310, 322-326 are connected to ground.

Based on the above described operation of n+m-bit two-stage charge-scaling DAC 300, reference voltage V$_{ref}$ 102 may be capacitively attenuated by the configuration of LSB array capacitors 306-310, terminating capacitor 318, scaling capacitor 320, and MSB array capacitors 322-326, which form, in effect, a variable capacitive voltage divider. Assuming that scaling capacitor C$_S$ 320 has a capacitance given by:

$$Cs = \frac{2^m}{2^m - 1} C \qquad (2)$$

wherein C is a unit capacitance value, the voltage at node 334 may be given by:

$$V(\text{node}_{334}) = [[b_0 2^{-m} + b_1 2^{-(m-1)} + \ldots + b_{m-1} 2^{-1}] \times 2^{-n} + [b_{0+m} 2^{-n} + b_{1+m} 2^{-(n-1)} + \ldots + b_{(n-1)+m} 2^{-1}]] V_{ref} \qquad (3)$$

or alternatively by:

$$V(\text{node}_{334}) = [b_0 + b_1 2 + \ldots + b_{m-1} 2^{m-1} + b_{0+m} 2^m + b_{1+m} 2^{m+1} + \ldots + b_{(n-1)+m} 2^{m+n-1}] \times 2^{-(n+m)} V_{ref} \qquad (4)$$

wherein $b_0$ corresponds with the digital value of the LSB of the n+m-bit digital word (i.e., the. LSB of the LSB array), $b_{m-1}$ corresponds with the digital value of the MSB of the LSB array, $b_{0+m}$ corresponds with the digital value of the LSB of the MSB array, $b_{(n-1)+m}$ corresponds with the digital value of the MSB of the n+m-bit digital word, and V$_{ref}$ corresponds with reference voltage 102. In some embodiments, the voltage at node 334 may be amplified using amplifier 336 placed in a negative feedback loop configuration to generate output 106.

A primary consideration in DAC design is the reduction of non-linearties in the response of the DAC. In an ideal DAC, the analog output voltage varies linearly from the received digital word of the input digital signal. In actual DAC implementations, however, some non-linearities in the response of a DAC can occur. These non-linearities are commonly characterized by a DAC's integral non-linearity ("INL") and differential nonlinearity ("DNL") response. A DAC may also be characterized by its gain error. In order to optimize DAC performance, minimizing INL, DNL, and gain error is important.

To minimize the INL, DNL, and gain error of two-stage charge scaling DAC 300, scaling capacitor C$_S$ 320 is accurately manufactured to have the absolute capacitance value given by Equation 2. If C$_S$ 320 has the capacitance value given by Equation 2, then DAC 300 has the DAC output voltage response given by Equations 3 and 4. Capacitance values that vary from Equation 2 for scaling capacitor C$_S$ 320 can lead to non-linearity of the DAC, especially when the DAC is configured to convert a digital signal having a long digital word length (i.e., high-resolution digital signal). Current two-stage DACs are designed with a primary focus on achieving an idealized output response, and thus implement components that are precisely tuned to optimized performance.

In practice, manufacturing capacitors having accurate absolute capacitance values proves difficult. In some embodiments, trimming techniques may be utilized to achieve a desired capacitance value. While manufacturing capacitors having accurate absolute capacitance values proves difficult, manufacturing capacitors having accurate relative capacitance values is easier to achieve. Accordingly, DAC designs that have performance dependent upon relative capacitance values rather than absolute capacitance values are less prone to having actual responses that deviate from idealized responses. Thus, such designs sacrifice minimizing output response errors and non-linearities, considerations squarely addressed by the aforementioned designs with precisely tuned components, in exchange for achieving a response that is less prone to manufacturing errors.

Figure 4:
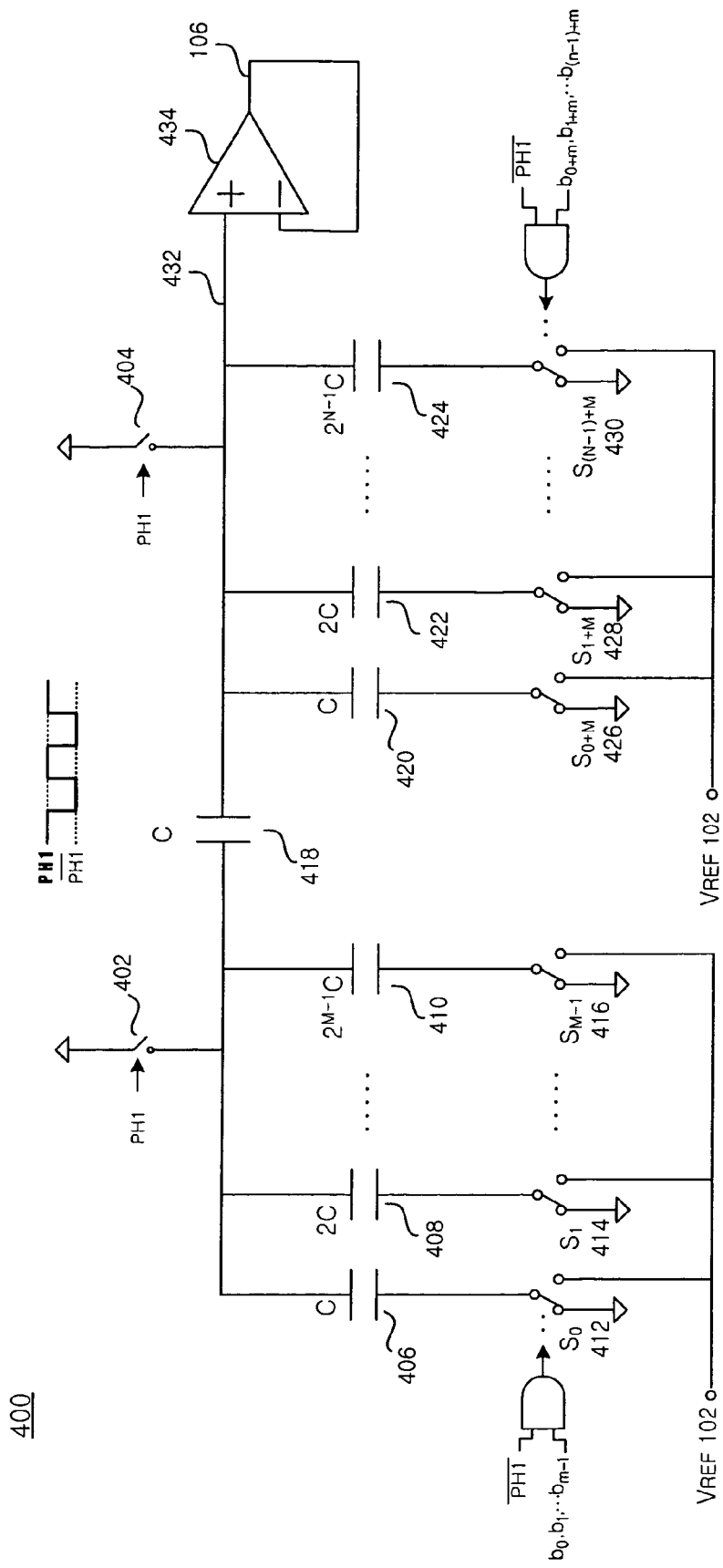
FIG. 4 illustrates a schematic diagram of a two-stage charge-scaling DAC utilizing unit-cell capacitors consistent with some embodiments of the present invention.

FIG. 4 illustrates a schematic diagram of a two-stage charge-scaling DAC utilizing unit-cell capacitors 400 consistent with some embodiments of the present invention. DAC 400, as illustrated in FIG. 4, is configured to convert an n+m-bit digital word having m LSBs and n MSBs. DAC 400 may include switches 402-404, LSB array capacitors 406-410, LSB array switches 412-416, unit-cell capacitor 418, MSB array capacitors 420-424, MSB array switches 426-430, and amplifier 434.

Switch 402 may be configured so that the top plates of LSB array capacitors 406-410 are coupled to ground when switch 402 is closed. Similarly, switch 404 may be configured so that node 432 and the top plates of MSB array capacitors 420-424 are also coupled to ground when switch 404 is closed. In some embodiments, switch 402 and switch 404 may be integrated into a single switch capable of coupling the top plates of LSB array capacitors 406-410 and the top plates of MSB array capacitors 420-424 to ground. Unit-cell capacitor 418 may be coupled between the top plates of LSB array capacitors 406-410 and node 432. Node 432 may also be coupled to amplifier 434. In some embodiments, node 432 may be coupled to the non-inverting input terminal of amplifier 434, and amplifier output 106 may be coupled to the inverting input terminal of amplifier 434, placing amplifier 434 in a negative feedback loop configuration.

As illustrated in FIG. 4, LSB array bit switches 412-416 may be coupled to the bottom plates of LSB array capacitors 406-410 and configured such that the bottom plates of LSB array capacitors 406-410 may be coupled to either ground or reference voltage $V_{ref}$ 102 depending on the orientation of LSB array bit switches 412-416. In some embodiments, the orientation of LSB array bit switches 412-416 is dependent upon the digital values of the m LSBs corresponding with LSB array bit switches 412-416 in a received n+m-bit digital word having m LSBs and n MSBs. For example, if the LSB of an n+m-bit digital word being converted by two-stage charge-scaling DAC utilizing unit-cell capacitors 400 is set to a digital value of 1, LSB array bit switch $S_0$ 412 may be switched to couple the bottom plate of LSB array capacitor 406 to reference voltage $V_{ref}$ 102. Similarly, if the MSB in the LSB array is set to a digital value of 0, LSB array bit switch $S_{M-1}$ 416 may be switched to couple the bottom plate of LSB array capacitor 410 to ground.

MSB array bit switches 426-430 may be coupled to the bottom plates of MSB array capacitors 420-424 and configured such that the bottom plates of MSB array capacitors 420-424 may be coupled to either ground or reference voltage $V_{ref}$ 102 depending on the orientation of MSB array switches 426-430. In some embodiments, the orientation of MSB array bit switches 426-430 is dependent upon the digital value of the n MSBs corresponding with MSB array bit switches 426-430 in a n+m-bit digital word. For example, if the LSB in the MSB array is set to a digital value of 1, MSB array bit switch $S_{0+M}$ 426 may be switched to couple the bottom plate of MSB array capacitor 420 to reference voltage $V_{ref}$ 102. Similarly, if the MSB of the n+m-bit digital word under conversion is set to a digital value of 0, MSB array bit switch $S_{(N-1)+M}$ 430 may be switched to couple the bottom plate of MSB array capacitor 424 to ground.

DAC 400 uses capacitors having relative sizes directly proportional to a unit capacitance value C. For example, unit-cell capacitor 418 and LSB array capacitor 406 as illustrated have a capacitance value of C. Capacitor 408 has a capacitance value of 2C. Thus, the capacitance value of capacitor 408 is two times the capacitance value of capacitor 406. By utilizing unit-cell capacitors in the design of two-stage charge-scaling DAC 400, the effects of semiconductor manufacturing errors are reduced, as capacitors having accurate relative capacitance values may be fabricated more precisely than capacitors having accurate absolute capacitance values.

Prior to receiving an n+m-bit digital word contained in a digital signal for conversion by n+m-bit two-stage charge-scaling DAC utilizing unit-cell capacitors 400, switches 402 and 404 may be closed, thereby coupling the top plates of LSB array capacitors 406-410 and MSB array capacitors 420-424 as well as both plates of unit-cell capacitor 418 and the non-inverting input of amplifier 434 to ground. In some embodiments, the duration of time that switches 402 and 404 are closed may be related to the discharge time(s) of LSB array capacitors 406-410, MSB array capacitors 420-424, and/or unit-cell capacitor 418. Similarly, prior to receiving an n+m-bit digital word, LSB array bit switches 412-416 and MSB array bit switches 426-430 may also be switched to ground, thereby coupling the bottom plates of LSB array capacitors 406-410 and MSB array capacitors 420-424 to ground. In some embodiments, the duration of time that LSB array bit switches 412-416 and MSB array bit switches 426-430 are oriented such that the bottom plates of LSB array capacitors 406-410 and MSB array capacitors 420-424 are coupled to ground may be related to the discharge time(s) of LSB array capacitors 406-410 and/or MSB array capacitors 420-424.

Upon receiving an n+m-bit digital word, LSB array bit switches 412-416 and MSB array bit switches 426-430 may be switched from ground to reference voltage $V_{ref}$ 102 depending on the value of the bits in the received n+m-bit digital word corresponding with LSB array bit switches 412-416 and MSB array bit switches 426-430. For example, in an n+m-bit digital word having m LSBs and n MSBs, wherein the mth bit in the n+m-bit digital word has a digital value of one and all other bits have digital values of zero, LSB array bit switch $S_{M-1}$ 412 may be switched to reference voltage $V_{ref}$ 102, thereby coupling the bottom plate of LSB array capacitor 410 to $V_{ref}$ 102. Similarly, all LSB and MSB array bit switches 412-416, 426-430 corresponding to bits in the digital word having digital values of zero (i.e., $S_0$ 412, $S_1$ 414, $S_{M-1}$ 416, $S_{0+M}$ 426, and $S_{1+M}$ 428) may remain switched to ground such that the bottom plates of all capacitors coupled to such bit switches also remain coupled to ground. In some embodiments, after a period of time related to the charging time of LSB array capacitor 410, LSB array bit switch $S_{M-1}$ 412 may be switched such that the bottom plate of all LSB and MSB array capacitors 406-410, 420-424 are connected to ground.

In some embodiments, DAC 400 switches 402 and 404 and LSB array bit switches 412-416 and MSB array bit switches 426-430 may be driven by a pair of two-phase non-overlapping clock signals denoted as PH1 and $\overline{PH1}$. As illustrated in FIG. 4, switches 402 and 404 may be driven by clock signal PH1. Similarly, LSB array bit switches 412-416 and MSB array bit switches 426-430 may operate according to clock signal $\overline{PH1}$. When PH1 is at a high logic level and $\overline{PH1}$ is at a low logic level, switches 402 and 404 may be closed and LSB array bit switches 412-416 and MSB array bit switches 426-430 may be oriented such that the bottom plates of LSB array capacitors 406-410 and MSB array capacitors 420-424 are coupled to ground. Similarly, when PH1 is at a low logic level and $\overline{PH1}$ is at a high logic level, switches 402 and 404 may be opened and LSB array bit switches 412-416 and MSB array bit switches 426-430 may be oriented according to the values of the bits of the received digital word associated with each of LSB array bit switches 412-416 and MSB array bit switches 426-430. As illustrated in FIG. 4, this functionality may be implemented using a digital circuit configured to perform a logical AND operation (e.g., an AND gate) on clock signal $\overline{PH1}$ and the digital values of the bits of the received digital word corresponding respectively with LSB array bit switches 412-416 and MSB array bit switches 426-430 (i.e., the digital values of bits $b_0, b_1, \ldots b_{m-1}, b_{0+m}, b_{1+m}, \ldots$ and $b_{(n-1)+m}$) to generate corresponding enable signals for LSB and MSB array bit switches 412-416 and 426-430.

In some embodiments, clock signal PH1 may be set to a high logic level during a reset phase of DAC 400. Similarly, in certain embodiments, clock signal $\overline{PH1}$ may be set to a high logic level during a sampling phase of DAC 400.

Based on the above described operation of n+m-bit two-stage charge-scaling DAC utilizing unit-cell capacitors 400, reference voltage $V_{ref}$ 102 may be capacitively attenuated at node 432 to a level which is dependent upon the configuration of LSB array capacitors 406-410, unit-cell capacitor 418, and MSB array capacitors 420-424, which form, in effect, a variable capacitive voltage divider. Accordingly, the voltage at node 432 may be given by:

$$V(node_{432}) = [b_0 + b_1 2 + \ldots + b_{m-1} 2^{m-1} + b_{0+m} 2^m + \\ b_{1+m} 2^{m+1} + \ldots + b_{(n-1)+m} 2^{m+n-1}] \frac{1}{2^{(n+m+1)} - 1} V_{ref} \quad (5)$$

wherein $b_0$ corresponds with the digital value of the LSB of the n+m-bit digital word (i.e., the LSB of the LSB array), $b_{m-1}$ corresponds with the digital value of the MSB of the LSB array, $b_{0+m}$ corresponds with the digital value of the LSB of the MSB array, $b_{(n-1)+m}$ corresponds with the digital value of the MSB of the n+m-bit digital word, and $V_{ref}$ corresponds with reference voltage 102. In some embodiments, the voltage at node 432 may be buffered using amplifier 434 placed in a negative feedback loop configuration to generate output 106.

As previously discussed, non-linearities in the response of a DAC may be characterized by its INL and DNL response. A DAC's DNL characterizes the linearity of the DAC's analog output voltage in response to one incremental change in the input digital signal. Ideally, a change of one LSB of the digital input word under conversion corresponds to a proportional one LSB change in the analog output signal voltage. DNL occurs when the incremental change in the magnitude of the analog output is not directly proportional to the incremental change of the digital input. If DNL is greater than one LSB, the incremental change in the magnitude of the analog output may decreases as the magnitude of the digital input increases, thereby causing the converter to become non-monotonic. For two-stage charge-scaling DAC utilizing unit-cell capacitors 400, worst-case DNL may be given by:

$$DNL = \frac{1}{2^{(n+m)} - 1} V_{LSB} \quad (6)$$

where $V_{LSB}$ is the voltage at node 432 when the LSB of a n+m-bit digital word received by DAC 400 is at a digital value of one and all other bits are set to zero, given by:

$$V_{LSB} = \frac{1}{2^{(n+m)}} V_{ref} \quad (7)$$

A DAC's INL characterizes the deviation of a DAC's transfer function from an ideal linear response. The INL of two-stage charge scaling DAC utilizing unit-cell capacitors 400 may be given in terms of the incremental analog output change corresponding with an incremental change in the digital input signal. For DAC 400, INL may equal the corresponding change of one LSB.

In addition, as discussed above, two-stage DAC utilizing unit-cell capacitors 400 may also be characterized by it's gain error. Gain error characterizes the actual gain response of DAC 400 in comparison with its idealized gain response. For two-stage charge-scaling DAC utilizing unit-cell capacitors 400, gain error may be given by:

$$\text{gain\_error} = \frac{1}{2^{(n+m)} + 1} \quad (8)$$

In the preceding specification, various preferred embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A digital-to-analog converter comprising:
   a first switch capable of coupling a first circuit node to ground;
   a second switch capable of coupling a second circuit node to ground;
   a scaling capacitor coupled between the first and the second circuit node;
   a first array of capacitors coupled to the first circuit node;
   a first switching array coupled to the first array of capacitors opposite to the first circuit node and configured to selectively couple the first array of capacitors to either ground or a reference voltage;
   a second array of capacitors coupled to the second circuit node; and
   a second switching array coupled to the second array of capacitors opposite to the second circuit node and configured to selectively couple the second array of capacitors to either ground or the reference voltage;
   wherein the scaling capacitor has a capacitance value that equals a unit capacitance value, and wherein the second circuit node is coupled to an output terminal of the digital-to-analog converter.

2. The digital-to-analog converter of claim 1, wherein the first array of capacitors and the first switching array are associated with m number of least significant bits in a n+m-bit digital word.

3. The digital-to-analog converter of claim 2, wherein the second array of capacitors and the second switching array are associated with n number of most significant bits in the n+m-bit digital word.

4. The digital-to-analog converter of claim 2, wherein the first array of capacitors and first switching array comprise m number of capacitors and m number of switches respectively.

5. The digital-to-analog converter of claim 3, wherein the second array of capacitors and second switching array comprise n number of capacitors and n number of switches respectively.

6. The digital-to-analog converter of claim 2, wherein the capacitance values of the capacitors in the first capacitor array range from the unit capacitance value to $2^{m-1}$ times the unit capacitance value.

7. The digital-to-analog converter of claim 3, wherein the capacitance values of the capacitors in the second capacitor array range from the unit capacitance value to $2^{n-1}$ times the unit capacitance value.

8. The digital-to-analog converter of claim 1, further comprising an amplifier coupled to the second circuit node configured to amplify the voltage at the second circuit node.

9. The digital-to-analog converter of claim 8, wherein the amplifier is in a negative feedback loop configuration.

10. The digital-to-analog converter of claim 1, wherein the switch is configured to couple the first and second circuit nodes to ground and the first and second switching arrays are configured to couple the first and second arrays of capacitors respectively to ground during a reset period.

11. The digital-to-analog converter of claim 10, wherein the first and second switching arrays are configured to selectively couple the first and second arrays of capacitors respectively to either ground or a reference voltage during a sampling period.

12. The digital-to-analog converter of claim 11, wherein the reset period and the sampling period are respectively determined by first and second non-overlapping clock signals.

13. The digital-to-analog converter of claim 2, wherein the first switching array is configured to couple the capacitors in the first array of capacitors that are associated with the least significant bits of the received n-bit digital word having a digital value of one to the reference voltage.

14. The digital-to-analog converter of claim 3, wherein the second switching array is configured to couple the capacitors in the second array of capacitors that are associated with the most significant bits of the received n+m-bit digital word having a digital value of one to the reference voltage.

15. A method for converting a digital signal containing an n-bit digital word to an analog signal, the method comprising:
   coupling a first circuit node to ground with a first switch, and coupling a second circuit node to ground with a second switch, the first and second circuit nodes being separated by a unit-cell scaling capacitor;
   coupling a first and a second array of capacitors respectively coupled to the first and second circuit nodes to ground using a first and a second switching array;
   de-coupling the first and second circuit nodes from ground with the first and second switches;
   selectively coupling the first array of capacitors to either ground or a reference voltage based on the digital values of the least significant bits in a n+m-bit digital word;
   selectively coupling the second array of capacitors to either ground or the reference voltage based on the digital values of the most significant bits in the n+m-bit digital word and
   coupling the second circuit node to an output terminal of the digital-to-analog converter.

16. The method of claim 15, wherein the steps coupling the first and second circuit node to ground and coupling the first and second array of capacitors to ground are performed during a reset period.

17. The method of claim 16, wherein the steps of selectively coupling the first and second array of capacitors to either ground or the reference voltage are performed during a sampling period.

18. The method of claim 17, wherein the reset period and the sampling period are respectively determined by first and second non-overlapping clock signals.

* * * * *